(12) United States Patent
Khojasteh et al.

(10) Patent No.: US 7,217,496 B2
(45) Date of Patent: May 15, 2007

(54) FLUORINATED PHOTORESIST MATERIALS WITH IMPROVED ETCH RESISTANT PROPERTIES

(75) Inventors: Mahmoud Khojasteh, Poughkeepsie, NY (US); Pushkara Rao Varanasi, Poughkeepsie, NY (US); Wenjie Li, Poughkeepsie, NY (US); Kuang-Jung J Chen, Poughkeepsie, NY (US); Kaushal S. Patel, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 10/988,137

(22) Filed: Nov. 12, 2004

(65) Prior Publication Data

US 2006/0105269 A1    May 18, 2006

(51) Int. Cl.
| | | |
|---|---|---|
| G03C 1/73 | (2006.01) | |
| G03F 7/038 | (2006.01) | |
| G03F 7/039 | (2006.01) | |
| G03F 7/20 | (2006.01) | |
| G03F 7/30 | (2006.01) | |
| G03F 7/36 | (2006.01) | |

(52) U.S. Cl. .................. 430/270.1; 430/325; 430/326; 430/907; 430/910; 430/921; 430/925; 430/330; 430/313; 430/331

(58) Field of Classification Search ...................... None
See application file for complete search history.

(56) References Cited

U.S. PATENT DOCUMENTS

| | | | |
|---|---|---|---|
| 6,027,856 A | 2/2000 | Nozaki et al. | 430/281.1 |
| 6,074,801 A | 6/2000 | Iwasa et al. | 430/270.1 |
| 6,106,998 A | 8/2000 | Maeda et al. | 430/280.1 |
| 6,140,010 A | 10/2000 | Iwasa et al. | 430/270.1 |
| 6,146,806 A | 11/2000 | Maeda et al. | 430/170 |
| 6,255,041 B1 | 7/2001 | Oomori et al. | 430/322 |
| 6,265,135 B1 | 7/2001 | Kodama et al. | 430/286.1 |
| 6,319,650 B1 | 11/2001 | Gelorme et al. | 430/270.1 |
| 6,503,686 B1 | 1/2003 | Fryd et al. | 430/270.1 |
| 6,511,787 B2 | 1/2003 | Harada et al. | 430/270.1 |
| 6,548,219 B2 | 4/2003 | Ito et al. | 430/270.1 |
| 6,610,456 B2 | 8/2003 | Allen et al. | 430/270.1 |
| 2002/0061464 A1 | 5/2002 | Aoai et al. | 430/270.1 |
| 2002/0155376 A1 | 10/2002 | Hashimoto et al. | 430/270.1 |
| 2003/0078352 A1* | 4/2003 | Miyazawa et al. | 526/245 |
| 2003/0224283 A1 | 12/2003 | Allen et al. | 430/270.1 |
| 2003/0235785 A1 | 12/2003 | Barclay et al. | 430/271.1 |

FOREIGN PATENT DOCUMENTS

JP    2004-302189    * 10/2004

OTHER PUBLICATIONS

Machine-assisted English translation of JP 2004-302189 provided by JPO.*
Y.C. Bae, et al. Rejuvenation of 248 nm Resist Backbones for 157 nm Lithography, Journal of Photopolymer Science and Technology, vol. 14, No. 4, pp. 613-620 (2001).
T.H. Fedynyshyn et al., High Resolution Fluorocarbon Based Resist for 157 nm Lithography, Advances in Resist Technology and Processing XVIII, Francis M. Houlihan, ed., Proceedings of SPIE, vol. 4345, pp. 296-307 (2001).
H. Ito, et al. Polymer Design for 157 nm Chemically Amplified Resists, Advances in Resist Technology and Processing XVIII, Francis M. Houlihan, ed. Proceedings of SPIE, vol. 4345, pp. 273-284 (2001).
R.R. Kunz, et al. Experimental VUV Absorbance Study of Fluorine-Functionalized Polystyrenes, Advances in Resist Technology and Processing XVIII, Francis M. Houlihan, ed., Proceedings of SPIE, vol. 4345, pp. 285-295 (2001).

* cited by examiner

Primary Examiner—Sin Lee
(74) Attorney, Agent, or Firm—Steven Capella; Margaret A. Pepper

(57) ABSTRACT

A photoresist composition including a polymer is disclosed, wherein the polymer includes at least one monomer having the formula:

$$\left( \begin{array}{c} R_1 \\ \diagup \\ \diagdown \\ O \end{array} \!\!\! - \!\! O - R_2 - \!\! \left( \!\! X - R_3 - \!\! \begin{array}{c} R_4 \\ | \\ | \\ R_5 \end{array} \!\! - OR_{12} \right) \!\! \right)_n$$

where $R_1$ represents hydrogen (H), a linear, branched or cyclo alkyl group of 1 to 20 carbons, a semi- or perfluorinated linear, branched or cyclo alkyl group of 1 to 20 carbons or CN; $R_2$ represents an alicyclic group of 5 or more carbon atoms; X represents a methylene, ether, ester, amide or carbonate linkage; $R_3$ represents a linear or branched alkylene group or semi- or perfluorinated linear or branched alkylene group with 1 or more carbon atoms; $R_4$ represents hydrogen (H), methyl ($CH_3$), trifluoromethyl ($CF_3$), difluoromethyl ($CHF_2$), fluoromethyl ($CH_2F$), or a semi- or per-flourinated aliphatic group; $R_5$ represents trifluoromethyl ($CF_3$), difluoromethyl ($CHF_2$), fluoromethyl ($CH_2F$), or a semi- or perfluorinated substituted or unsubstituted aliphatic group; n represents an integer of 1 or more; and $OR_{12}$ represents OH or at least one acid labile group selected from a tertiary alkyl carbonate, a tertiary alkyl ester, a tertiary alkyl ether, an acetal and a ketal. A method of patterning a substrate is also disclosed, wherein the method includes: applying the photoresist composition mentioned above to the substrate to form a film; patternwise exposing the film to an imaging radiation source; and developing areas of the film to form a patterned substrate.

26 Claims, No Drawings

FLUORINATED PHOTORESIST MATERIALS WITH IMPROVED ETCH RESISTANT PROPERTIES

BACKGROUND OF THE INVENTION

1. Field of the Invention

The present invention relates to a photoresist composition and, more particularly, to a photoresist composition that includes a polymer having at least one monomer that includes an acrylate or methacrylate group and further includes at least one fluoroalcohol group.

2. Description of the Related Art

The fabrication of advanced logic and memory devices involves patterning features with minimum ground rules which are constantly shrinking. Features less than 100 nm in size are initially formed in a high resolution resist which is patternwise exposed using exposure tools with wavelengths below 200 nm such as 193 nm, 157 nm, and 13 nm (EUV). Subsequently, the resist serves as an etch mask as openings in the pattern are transferred into the substrate. Therefore, the resist must not only have a desirable optical density at the exposure wavelength, but also have sufficient etch resistance to enable successful transfer of the image from patterned resist to the underlying substrate and to prevent edge roughness and an unacceptable etch bias in the resulting substrate pattern. Furthermore, high resolution features with the desired profiles are only achieved when the resist has an appropriate dissolution behavior in the aqueous base developer employed in the patterning process. For positive tone resists, a high dissolution rate in exposed regions ($R_{max}$) and a low dissolution rate in unexposed regions ($R_{min}$) is needed. However, $R_{min}$ should not be too low in order to avoid a skin or so called T-top on the patterned resist. For negative tone resists, unexposed regions should have a high dissolution rate to avoid scumming while exposed regions are typically crosslinked easily with a negligible film loss in the developer.

A trend in the industry is to incorporate fluorine (as C—F bonds) in the polymer composition which is the largest component of the coated resist film. Current advanced resists are based on polymers of methacrylates, acrylates, cyclic olefins or copolymers thereof. A beneficial attribute of fluorinated polymers is their low optical density.

For example, U.S. Patent Application Publication No. 2003/0224283 by Allen et al. discloses a photoresist composition that includes a polymer having at least one acrylate or methacrylate monomer with a fluoroalcohol moiety.

Unfortunately, increasing the fluorine content in a resist film decreases its etch resistance. Additionally, the dissolution rate of a resist may be difficult to adjust to a desirable range because of the fluorine content. Low etch resistance for polymers containing commercially available methacrylate or acrylate units are still a major concern. Therefore, improved polymers for high resolution resists are needed which have an acceptable optical density and dissolution behavior as well as higher etch resistance compared to state of the art polymers comprised of fluoroalcohol moieties.

SUMMARY OF THE INVENTION

The present invention is directed to a photoresist composition comprising a polymer, the polymer comprising at least one monomer having the formula:

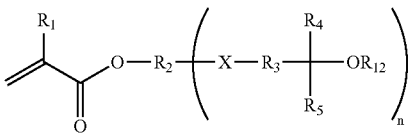

where $R_1$ is selected from the group consisting of hydrogen (H) a linear, branched or cyclo alkyl group of 1 to 20 carbons, a semi- or perfluorinated linear, branched or cyclo alkyl group of 1 to 20 carbons, and CN; $R_2$ is an alicyclic group of 5 or more carbon atoms; X is a linkage selected from the group consisting of methylene, ether, ester, amide and carbonate; $R_3$ is a linear or branched alkylene group or semi- or perfluorinated linear or branched alkylene group with 1 or more carbon atoms; $R_4$ is selected from the group consisting of hydrogen (H), methyl ($CH_3$), trifluoromethyl ($CF_3$), difluoromethyl ($CHF_2$), fluoromethyl ($CH_2F$), and a semi- or perflourinated aliphatic group; $R_5$ is selected from the group consisting of methyl ($CF_3$), difluoromethyl ($CHF_2$), fluoromethyl ($CH_2F$), and a semi- or perfluorinated substituted or unsubstituted aliphatic group;

n is an integer of 1 or more; and $OR_{12}$ is OH or at least one acid labile group selected from a tertiary alkyl carbonate, a tertiary alkyl ester, a tertiary alkyl ether, an acetal and a ketal.

In another aspect, the invention is directed to a method of patterning a substrate, the method comprising: applying the photoresist composition mentioned above to the substrate to form a film; patternwise exposing the film to an imaging radiation source; and developing areas of the film to form a patterned substrate.

DETAILED DESCRIPTION OF THE INVENTION

The present invention is centered on the development of a family of methacrylate/acrylate monomers and polymers containing this monomer for advanced photoresist application. The photoresist compositions of the invention include a polymer comprising a monomer having a polymerizable acrylate or methacrylate group. It is to be understood that, although a monomer may be described herein as a particular methacrylate, the monomers are defined herein to include the analogous acrylate formula, and vice versa.

Specifically, in one embodiment, the photoresist composition of the invention comprises a polymer, which comprises at least one monomer having the following formula:

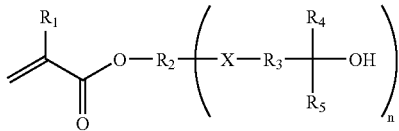

where $R_1$ represents hydrogen (H), a linear, branched or cyclo alkyl group of 1 to 20 carbons, a semi- or perfluorinated linear, branched or cyclo alkyl group of 1 to 20 carbons or CN; $R_2$ represents an alicyclic group of 5 or more carbon atoms; X represents a methylene, ether, ester, amide or carbonate linkage; $R_3$ represents a linear or branched alkylene group or semi- or perfluorinated linear or branched alkylene group with 1 or more carbon atoms, preferably 1 to 10 carbon atoms; $R_4$ represents hydrogen (H), methyl ($CH_3$), trifluoromethyl ($CF_3$), difluoromethyl ($CHF_2$), fluoromethyl ($CH_2F$), or a semi- or perflourinated aliphatic group; $R_5$ represents trifluoromethyl ($CF_3$), difluoromethyl ($CHF_2$), fluoromethyl ($CH_2F$), or a semi- or perfluorinated substituted or unsubstituted aliphatic group; and n represents an integer of 1 or more, preferably 1 or 2.

The alicyclic group, $R_2$, may be a bulky alicyclic group of 5 to 20 carbon atoms, and may include one of the following structures:

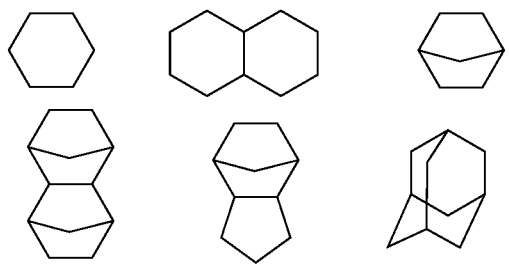

The linkage moiety, X, may include one of the following structures:

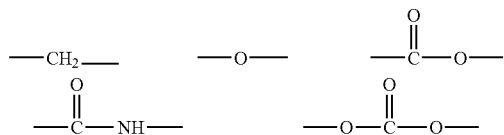

Examples of monomers according to the present invention include:

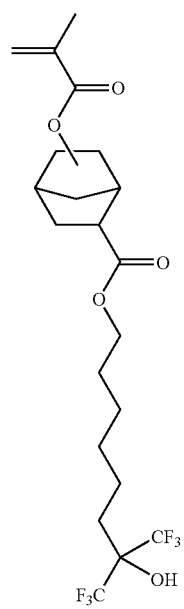

(I)

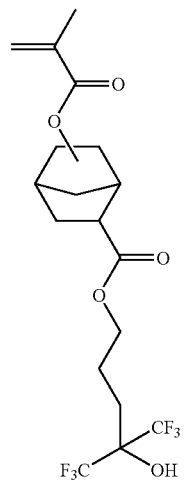

(II)

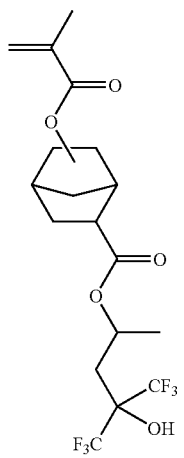

(III)

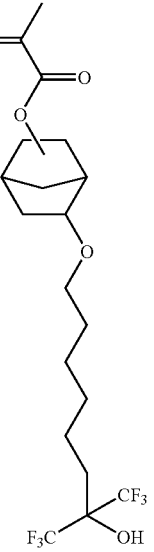

(IV)

(V)
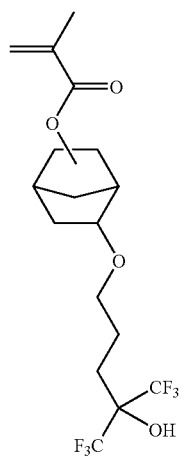
(VI)
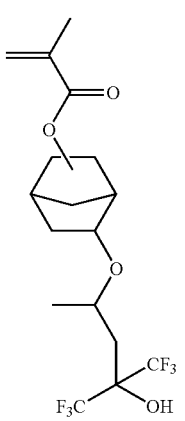
(VII)
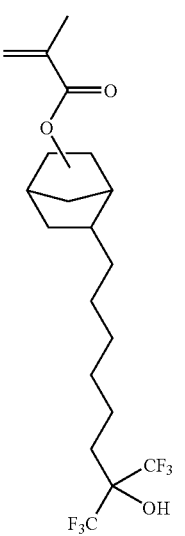
(VIII)
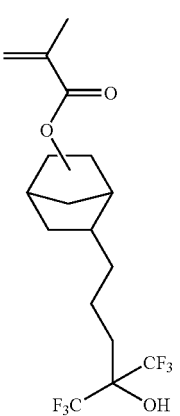
(IX)
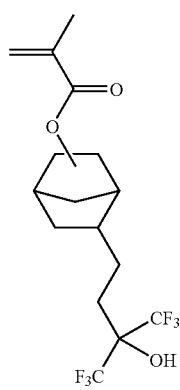
(X)
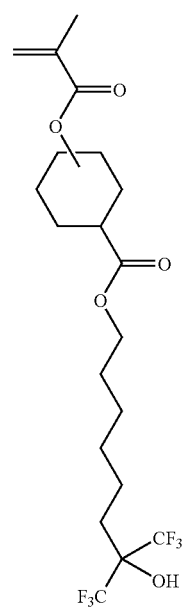

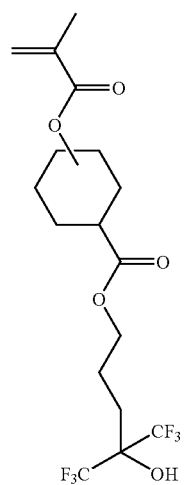 (XI)
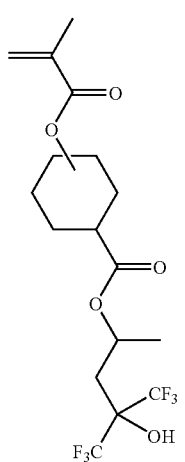 (XII)
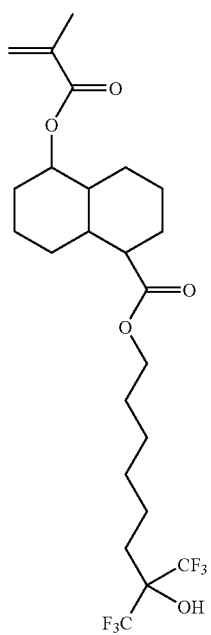 (XIII)
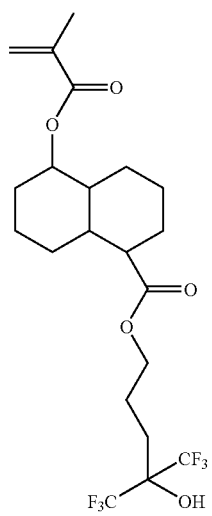 (XIV)
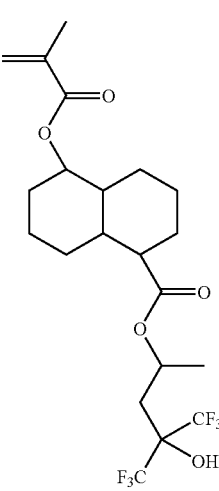 (XV)
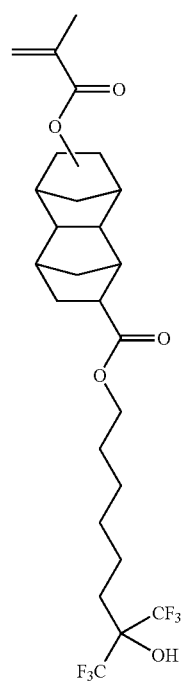 (XVI)

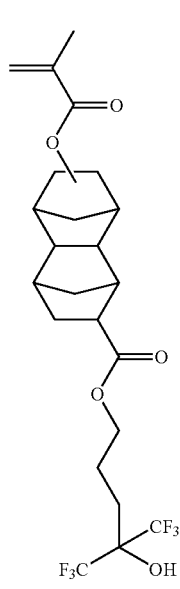 (XVII)
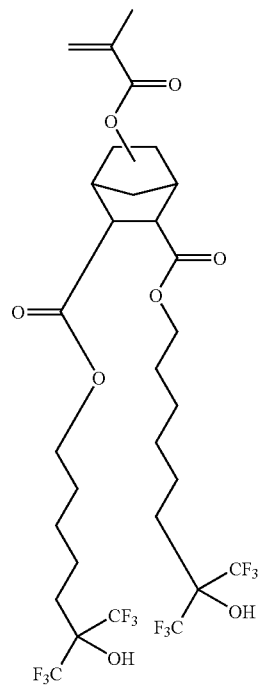 (XIX)
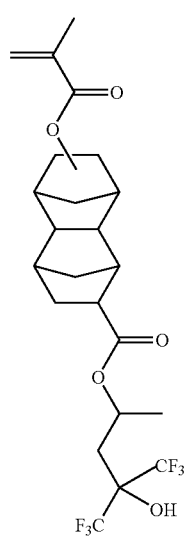 (XVIII)
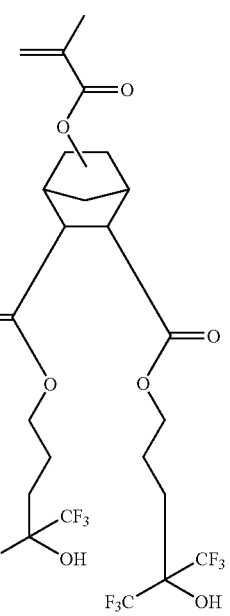 (XX)

The photoresist composition may further include at least one of a solvent, photoacid generator, crosslinking agent, basic compound, surfactant, latent basic compound, photobase generator, dissolution inhibitor, dissolution accelerator, adhesion promoter, and defoaming agent. These additional materials can be included to provide desired properties. A crosslinking agent can be included, for example, in a negative tone photoresist, or an agent containing an acid labile group can be included, for example, in a positive tone photoresist.

Photoacid generators, also known as radiation sensitive acid generators, are compounds which will generate an acid upon exposure to energy. Any suitable photoacid generating agent may be used so long as a mixture of the photoresist composition of the present invention and the photoacid generator dissolves sufficiently in an organic solvent and the resulting solution thereof can form a uniform film by a film-forming process such as spin coating or the like. Illustrative classes of such photoacid generators that can be employed in the present invention include, but are not limited to, onium salts, succinimide derivatives, diazo compounds, and nitrobenzyl compounds. More specifically, the photoacid generator may comprise at least one of 4-(1-butoxynaphthyl) tetrahydrothiophenium perfluorobutane-sulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-butylphenyl)iodonium camphoresulfonate, and perfluorobutylsulfonyloxybicylo[2.2.1]-hept-5-ene-2,3-dicarboximide.

The polymer may also include one or more co-monomers. Co-monomers can be selected based upon the properties desired in the photoresist composition. For example, co-monomers can provide crosslinking groups desired in a negative tone photoresist. A crosslinking group provides functionality, which, upon treatment with a catalyst, exposes an electrophilic center or centers capable of subsequent reaction with an intrinsic, polymeric nucleophile. This reaction induces a solubility change among the affected polymer chains rendering them insoluble in basic developer.

If it is desired that the photoresist composition is a negative tone photoresist, the photoresist composition may further include a crosslinking agent, which may be added during formulation of the composition. Examples of such crosslinking agents include, but are not limited to, glycouril, melamine, epoxide, furyl, tetrahydrofuryl, vinyl ether, and combinations thereof. Exemplary glycourils include the following:

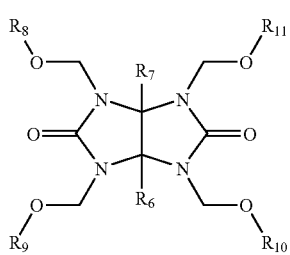

where $R_6$, $R_7$, $R_8$, $R_9$, $R_{10}$ and $R_{11}$ each represent hydrogen or an aliphatic group or an aromatic group. One particular example of a suitable glycouril is POWDERLINK®, available from Cytec (West Paterson, N.J.).

Additionally, in a negative photoresist composition, the monomers can be polymerized with co-monomers that contain a nucleophilic site, such as an alcohol. In such cases, a separate crosslinking agent can be added during photoresist formulation. Preferably, such a crosslinking agent attaches to the polymer of the resist composition through the nucleophile during processing. As discussed above, examples of such crosslinking agents include but are not limited to glycouril, melamine, epoxide, and vinyl ether, and combinations thereof. Examples of such nucleophilic co-monomers include:

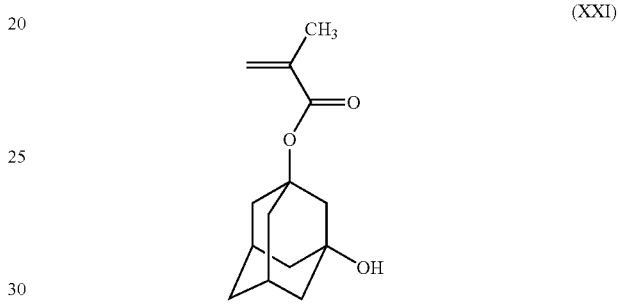

(XXI)

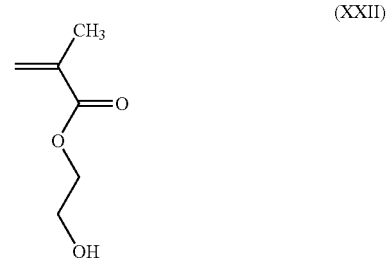

(XXII)

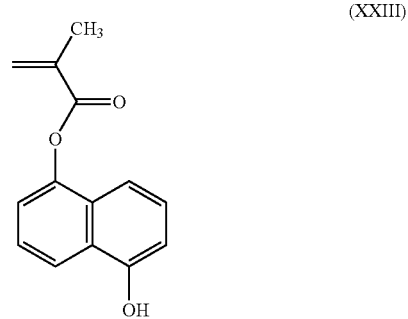

(XXIII)

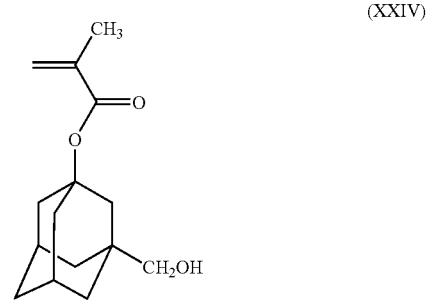

(XXIV)

-continued

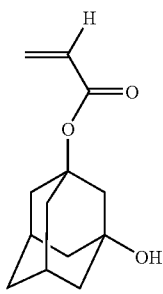
(XXV)

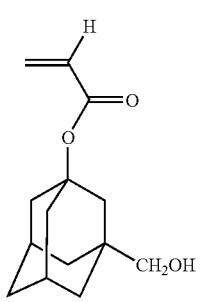
(XXVI)

Similarly, specific co-monomers can be selected for use in a positive tone photoresist. Such monomers can be chosen from the group of monomers that contain acid labile moieties such as tertiary alkyl carbonates, tertiary alkyl esters, tertiary alkyl ethers, acetals or ketals. Examples of such co-monomers include the following:

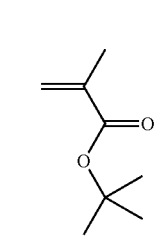
(XXVII)

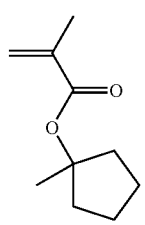
(XXVIII)

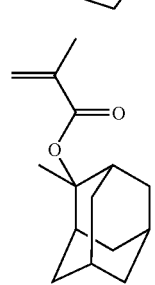
(XXIX)

-continued

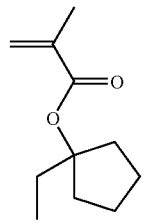
(XXX)

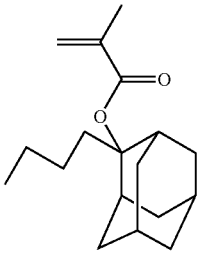
(XXXI)

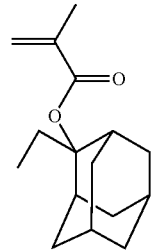
(XXXII)

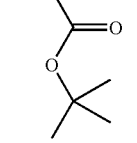
(XXXIII)

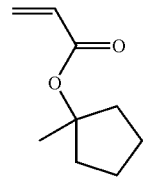
(XXXIV)

(XXXV)

Similarly, specific co-monomers can be selected for use in either negative or positive tone photoresists. For example, such co-monomers can contain at least one polar group, such as lactone, sulfonamide, anhydride, and carboxylic acid. Such groups can, for example, allow for the regulation of dissolution properties, thermal properties and etch resistance. For example, the co-monomer can include acrylic acid and/or methacrylic acid to acclerate dissolution of unexposed resist. Examples of co-monomers that include at least one polar group include:

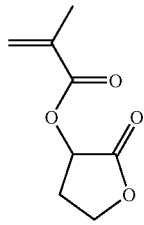
(XXXVI)

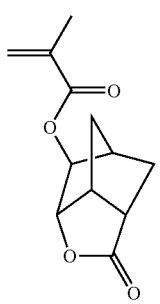
(XXXVII)

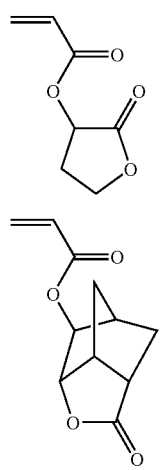
(XXXVIII)

(XXXIX)

In another embodiment, the photoresist composition of the present invention comprises a polymer, which comprises at least one monomer having the following formula:

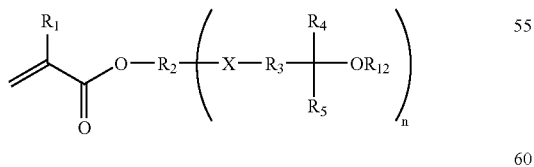

where $R_1$, $R_2$, X, $R_3$, $R_4$, $R_5$ and n are as defined previously; and $OR_{12}$ represents at least one acid labile group selected from a tertiary alkyl carbonate, a tertiary alkyl ester, a tertiary alkyl ether, an acetal and a ketal. When $OR_{12}$ is a tertiary alkyl carbonate group, it may have the following structure:

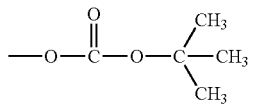

When $OR_{12}$ is an acetal or ketal group, it may have at least one of the following structures:

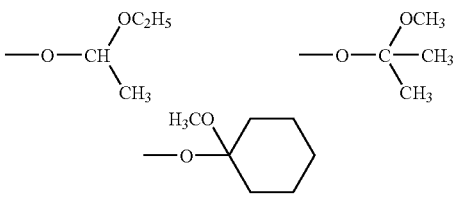

The following are examples of monomers according to the present invention containing such acetal and ketal acid labile groups:

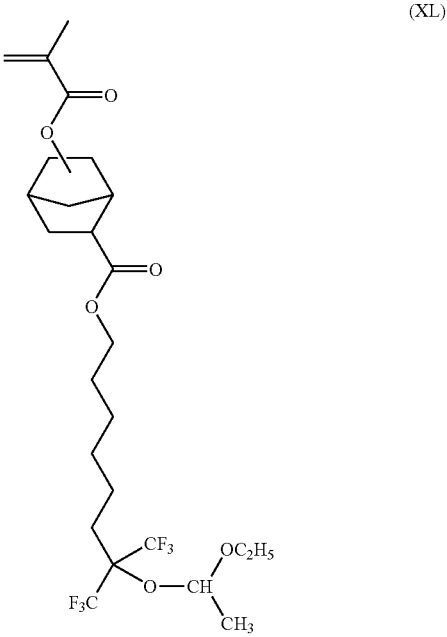
(XL)

(XLI)
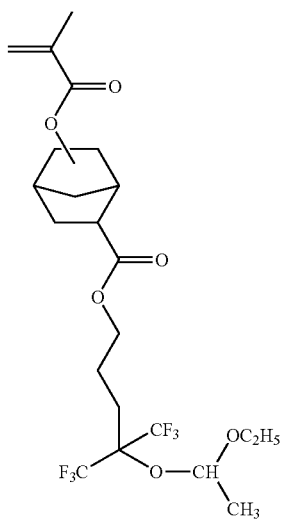

-continued

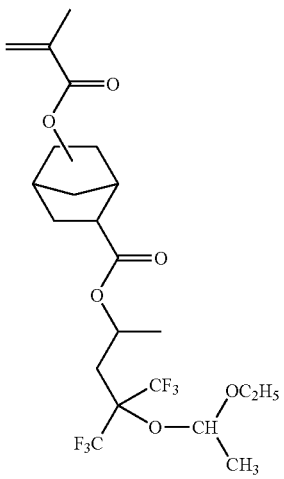
(XLII)

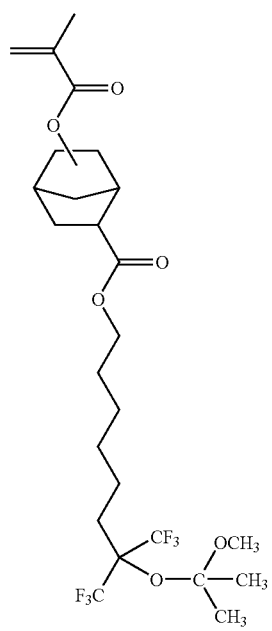
(XLIII)

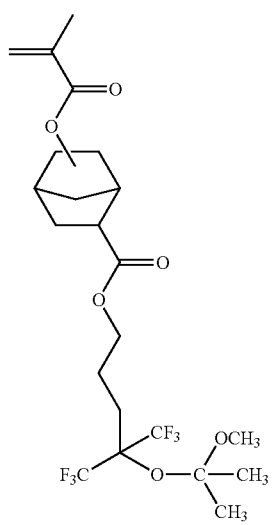
(XLIV)

-continued

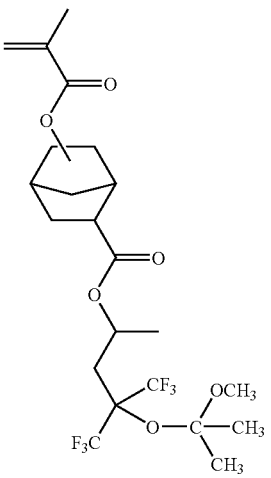
(XLV)

The acid-labile protecting groups are often classified by their activation energy which is the amount of energy required to cleave the protecting group to render sufficient solubility change in the resist system after the formation of strong acid from PAGs. The acetal and ketal groups are considered as low activation energy protecting groups, i.e., the activation energy is less than 25 kcavmol. The activation energy is often supplied by post-exposure bake (PEB) of the resist film. In the presence of photo-generated acid, the deprotection chemistry of the acetal and ketal groups can usually occur at low PEB temperatures such as <60° C. or even at room temperature, eliminating the need of the PEB step. The low PEB temperature would cause less diffusion of the photo-generated acids into the unexposed region and lead to less blur and better resolution in the resist.

The polymer in the photoresist composition is the reaction product of one or more monomers. The monomers can be polymerized by conventional means to form a polymer. The polymer will typically have a molecular weight between about 500 to about 500,000 daltons, preferably between about 1,000 to about 100,000 daltons, most preferably between about 5,000 to about 50,000.

For example, the desired monomers can be dissolved in an appropriate solvent that, at reflux, will afford a medium that maintains a constant temperature suitable for activation of the chosen initiator without inducing side reactions amongst the functional groups of the monomers. The solution can be prepared so as to afford a relatively high concentration of monomer, for example 30 wt %. The chosen initiator is then added and the solution is degassed by bubbling with dry nitrogen. The reaction flask is then immersed in preheated oil bath and allowed to reflux for several hours. After cooling the solution to room temperature, the polymer is isolated by precipitation into an excess volume, for example twenty-fold, of an appropriate nonsolvent. The polymer is isolated by filtration, washed with the nonsolvent and dried to constant weight under vacuum.

The photoresist compositions of the present invention may be prepared by combining the components (e.g., polymer, crosslinking agent, solvent, acid generator, base, and/or auxiliary components) using conventional methods known to those skilled in the art. For example, the polymeric material can be dissolved in an appropriate casting solvent along with performance enhancing additives such as, but not limited to, photoacid generators, crosslinking agents, basic compounds, surfactants, latent basic compounds, photobase generators, dissolution inhibitors, dissolution accelerators, adhesion promoters or defoaming agent. In general, these other components, when used, preferably comprise less than about 10 wt % of the photoresist composition, and most preferably less than about 1 wt % of the photoresist composition. Once all components are dissolved and distributed in the solution, the solution is filtered and optionally treated with, for example, ion exchanging media, so as to remove undesired components such as trace acids, bases or metals.

In various exemplary embodiments of the present invention, the photoresist composition of the invention may include: (i) about 1 to about 30 wt. % of the polymer, more preferably about 5 to about 15 wt. %; (ii) about 0.5 to about 20 wt. % of photoacid generator, based on the total weight of the polymer, more preferably about 0.5 to about 10 wt. %; and (iii) a solvent, which may typically be present in amounts of about 70 to about 99 wt. % of the composition, more preferably about 85 to about 95 wt. %.

In various exemplary embodiments, the photoresist composition may further include a quencher, which may typically be present in amounts of about 0.1 to about 1.0 wt. % based on the total weight of the polymer, and a surfactant, which may typically be present in amounts of about 0.001 to about 0.1 wt. % based on the total weight of the polymer.

The photoresist compositions of the present invention particularly useful as radiation-sensitive photoresists employed in the manufacture of electronic parts, especially semiconductor devices, or in the manufacture of photolithography masks using optical, electron beam, ion beam or x-ray radiation. Moreover, the compositions of the present invention may be employed for patterning printed circuit boards or photolithographic masks (i.e., photomasks), micromachining, the fabrication of microfluidic cells, or other related practices that require the definition of high resolution patterns.

The present invention encompasses a method of patterning a desired substrate, such as a silicon wafer, a chrome-on-glass mask blank, or a printed circuit board. The method includes applying to the substrate a coating of the photoresist composition as described above to form a film. The photoresist material can be applied by known means, such as spin casting.

The method also includes patternwise exposing the photoresist composition to an imaging radiation source, such as ultraviolet radiation of 193 or 157 nm. The areas of the photoresist exposed to the radiation source are then developed by, for example, immersion, puddle development, or other processes known to those skilled in the art. Developer solution can include, for example, dilute aqueous alkali solution, which may or may not contain a surfactant.

In the case of positive tone photoresists, the exposed areas of the film will be rendered soluble in the developer and can be washed away, leaving a pattern of the unexposed areas. In negative tone photoresists, the exposed areas of the film will be rendered insoluble and will remain after development of the unexposed areas. The developed image can then be rinsed with water to remove excess developer and dried. The patterned photoresist image can then be used as an etch mask for subsequent image transfer into the underlying substrate.

Pre-application, post-application, post-exposure, and post-development processes such as, for example, application of an anti-reflective coating, substrate priming, baking, flood exposure, or vapor treatment, may also be incorporated into the methodologies of the invention at least in part to enhance the performance and/or advantages of the present invention, as is known in the art. In particular, the incorporation of a post-application bake (PAB) to remove residual casting solvent of the photoresist film is highly desirable. A PAB process may include baking the desired substrate (e.g., wafer), at a temperature of about 80° C. to about 120° C. for a period of about 10 seconds to about 120 seconds. A preferred PAB is at 110° C. for 60 seconds.

Additionally, it may be desirable to include a post-exposure bake (PEB) in a manner consistent with the PAB methodology described above. Although it is not necessary for performance of many low activation energy chemically amplified photoresists, a PEB may be included to enhance lithographic imaging quality. A PEB process may include baking the wafer or substrate at a temperature of about 80° C. to about 120° C. for a period of about 10 seconds to about 120 seconds. A preferred PEB is at 110° C. for 60 seconds. It is to be appreciated that both PAB and PEB processes may be accomplished using conventional methods understood by those skilled in the art, such as, for example, contact hot plate baking, oven baking, proximity baking, etc. It may also be desirable to incorporate prior treatment of the substrate with a surface priming agent including, but not limited to, conventional silylating agents such as, for example, hexamethyldisilazane and/or related species by techniques known to those skilled in the art. Illustrative techniques suitable for use with the present invention include, without limitation, vapor priming and liquid puddle application.

The method can further include etching the patterned substrate using a conventional etching process that may include, but is not limited to, a reactive ion etch. In addition any remaining photoresist composition can be removed from the substrate, for example, using a stripping agent.

A distinction of these acrylate and methacrylate materials over others used in lithographic photoresist formulations are the incorporation of the fluorinated alcohols as the base-solubilizing moiety. These materials can have a pKa similar to that of the aforementioned phenolic materials (pKa ~9–11) and thus can exhibit similar dissolution characteristics in TMAH. This is in contrast to the acrylic acid or carboxylic acid derivatives that are often currently employed, which rely on the alkali solubility of the acid functionalities, which are significantly stronger acids (pKa ~3–6) and thus have distinct dissolution characteristics.

The acrylate-based or methacrylate-based compositions of the invention provide several distinct advantages over conventional materials. Firstly, a variety of synthetic variations are easily attainable through modification of the ester functionality. Secondly, these monomers readily undergo free-radical polymerization and are amenable to free-radical copolymerization with other co-monomers. Free radical polymerization is desirable as the functional group tolerance of this means of polymerization is high and control of molecular weight and polydispersity is facile. Thirdly, polymers derived from acrylate or methacrylate monomers are generally quite soluble in conventional casting solvents and form high quality, uniform films when cast on conventional substrates.

The photoresist compositions of the present invention offer several unique advantages over conventional compositions containing fluorinated alcohol. First, the relative fluorine content of the acrylate-based or methacrylate-based polymers of the present invention is less than that of other acrylate-based polymers containing a hexafluoroalcohol group, due largely to the bulky alicyclic group, $R_2$. For example, Table 1 illustrates that homopolymers of the following prior art monomers each have a fluorine content of greater than 30%.

Structures of monomers disclosed in U.S. 2003/0224283:

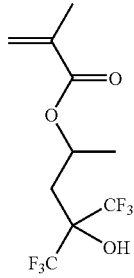
(XLVI)

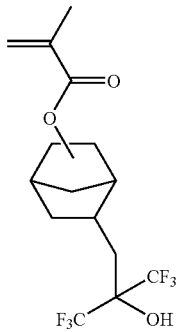
(XLVII)

In contrast, homopolymers of example monomer (I) of the present invention have a 23.2% fluorine content. The combination of reduction of fluorine to carbon atoms and the polycyclic structure helps to improve etch resistance and increase Tg of the resulting polymers.

TABLE 1

Comparison of fluorine content of different polymers

| POLYMER | Fluorine content (%) |
| --- | --- |
| Poly (XLVI) | 38.7 |
| Poly (XLVII) | 31.6 |
| Poly (I) | 23.2 |

Another advantage provided by monomer units of the present invention is increased acidity as compared to prior art monomer units, which enable a greater control over dissolution behavior. Less of the monomer unit of the invention is required in a co- or ter-polymer in order to achieve a good $R_{max}$ value. Since less of the monomer unit of the invention is needed compared to conventional monomer, the fluorine content is further reduced and etch resistance of the polymer further improves. It is believed that the spacer group results in a configuration where the hydroxyl group is no longer sterically hindered and thus is more easily solvated by an aqueous developer. FTIR studies indicate that the alcohol functionality of Poly(XLVI) and Poly(XLVII) are partially isolated and hindered, and therefore may not be accessible for interaction with aqueous developer. However, the alcohol functionality of polymers containing monomers according the present invention demonstrates extensive interaction with surrounding media including interaction with aqueous developer. It is believed that caging by aqueous developer through hydrogen bonding results in a lower O—H bond energy. In other words, a polymer of the present invention such as Poly (I) has a higher acidity than would be expected from a hexafluoroalcohol unit in Poly(XLVI) or Poly(XLVII), for example.

Although illustrative embodiments of the present invention have been described herein, it is to be understood that the invention is not limited to those precise embodiments, and that various other changes and modifications may be effected therein by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLE 1

Synthesis of 6-methacryloxy-bicyclo[2.2.1]heptane-2-carboxylic acid 8,8,8-trifluoro-7-hydroxy-7-trifluoromethyloctyl ester (I) homopolymer 6-Methacryloxy-bicyclo[2.2.1]heptane-2-carboxylic acid 8,8,8-trifluoro-7-hydroxy-7-trifluoromethyl-octyl ester (I) (4.740 g, 0.0100 mol), 2,2'-Azobisisobutyronitrile (AIBN) (0.098 g, 0.0006 mol), 1-dodecanethiol (0.040 g, 0.0002 mol) and 19 g of 2-butanone was placed in a round bottom flask equipped with a condenser and nitrogen inlet. The solution was degassed using nitrogen purge. The content was then heated to reflux for 12 hours. Afterwards, the solution was added dropwise into hexane (100 ml). The polymer was separated from organic phase by decantation. The solid was air dried for 2–3 hours & then was dissolved into 20 ml of acetone & added dropwise to 100 ml Di-water. The precipitated polymer was filtered, washed twice with Di-water (100 ml) and dried under vacuum at 65 C overnight.

EXAMPLE 2

Synthesis of 6-methacryloxy-bicyclo[2.2.1]heptane-2-carboxylic acid 5,5,5-trifluoro-4-hydroxy-4-trifluoromethyl-pentyl ester (II) homopolymer 6-methacryloxy-bicyclo[2.2.1]heptane-2-carboxylic acid 5,5,5-trifluoro-4-hydroxy-4-trifluoromethyl-pentyl ester (II) (2.160 g, 0.0050 mol), 2,2'-Azobisisobutyronitrile (AIBN) (0.049 g, 0.0003 mol), 1-dodecanethiol (0.020 g, 0.0001 mol) and 9 g of 2-butanone was placed in a round bottom flask equipped with a condenser and nitrogen inlet. The solution was degassed using nitrogen purge. The content was then heated to reflux for 12 hours. Afterwards, the solution was added dropwise into hexane (50 ml). The polymer was separated from organic phase by decantation. The solid was air dried for 2–3 hours & then was dissolved into 10 ml of acetone & added dropwise to 50 ml DI-water. The precipitated polymer was filtered, washed twice with DI-water (50 ml) and dried under vacuum at 65 C overnight.

EXAMPLE 3

Synthesis of 6-methacryloxy-bicyclo[2.2.1]heptane-2-carboxylic acid 4,4,4-trifluoro-3-hydroxy-1-methyl-3-trifluoromethyl-butyl ester (III) homopolymer 6-Methacryloxy-bicyclo[2.2.1]heptane-2-carboxylic acid 4,4,4-trifluoro-3-hydroxy-1-methyl-3-trifluoromethyl-butyl ester (III) (2.160 g, 0.0050 mol), 2,2'-Azobisisobutyronitrile (AIBN) (0.049 g, 0.0003 mol), 1-dodecanethiol (0.020 g, 0.0001 mol) and 9 g of 2-butanone was placed in a round bottom flask equipped with a condenser and nitrogen inlet. The solution was degassed using nitrogen purge. The content was then heated to reflux for 12 hours. Afterwards, the solution was added dropwise into hexane (50 ml). The polymer was separated from organic phase by decantation. The solid was air dried for 2–3 hours & then was dissolved into 10 ml of acetone & added dropwise to 50 ml DI-water. The precipitated polymer was filtered, washed twice with DI-water (50 ml) and dried under vacuum at 65 C overnight.

EXAMPLE 4

Synthesis of a Polymer for 193 nm Positive Tone Photoresists: Poly (I-co-XXIX-co-XXXVII)

6-Methacryloxy-bicyclo[2.2.1]heptane-2-carboxylic acid 8,8,8-trifluoro-7-hydroxy-7-trifluoromethyl-octyl ester (I) (3.160 g, 0.0066 mol), 2-methyl-2-adamantyl methacrylate (XXIX) (4.700, 0.0200 mol), 5-methacryloyloxy-2,6-norbornanecarbolactone (XXXVII) (3.930 g, 0.0177 mol), 2,2'-Azobisisobutyronitrile (AIBN) (0.435 g, 0.0026 mol), 1-dodecanethiol (0.178 g, 0.0008 mol) and 48 g of 2-butanone was placed in a round bottom flask equipped with a condenser and nitrogen inlet. The solution was degassed using nitrogen purge. The content was then heated to reflux for 12 hours. Afterwards, the solution was added dropwise into heptane (350 ml). The precipitated polymer was filtered and air dried for 2–3 hours and then redissolved in 50 g of 2-butanone & added dropwise into heptane (350 ml). The polymer was collected by filtration and dried under vacuum at 65 overnight.

EXAMPLE 5

Synthesis of a Polymer for 193 nm Negative Tone Photoresists: Poly (I-co-XXI-co-XXII)

6-Methacryloxy-bicyclo[2.2.1]heptane-2-carboxylic acid 8,8,8-trifluoro-7-hydroxy-7-trifluoromethyl-octyl ester (I) (6.032 g, 0.0127 mol), hydroxyadamentyl methacrylate (XXI) (4.720, 0.0200 mol), 2-hydroxyethyl methacrylate (XXII) (0.472 g, 0.0036), 2,2'-Azobisisobutyronitrile (AIBN) (0.357 g, 0.0021 mol), 1-dodecanethiol (0.146 g, 0.0007 mol) and 115 g of 2-butanone was placed in a round bottom flask equipped with a condenser and nitrogen inlet. The solution was degassed using nitrogen purge. The content was then heated to reflux for 12 hours. Afterwards, the solution was added dropwise into heptane (900 ml). The precipitated polymer was filtered and air dried for 2–3 hours and then redissolved in 115 g of 2-butanone & added dropwise into heptane (900 ml). The polymer was collected by filtration and dried under vacuum at 65 overnight.

EXAMPLE 6

Synthesis of ethylvinylether protected poly-6-methacryloxy-bicyclo[2.2.1]heptane-2-carboxylic acid 8,8,8-trifluoro-7-hydroxy-7-trifluoromethyl-octyl ester (poly(XL))

Poly-6-methacryloxy-bicyclo[2.2.1]heptane-2-carboxylic acid 8,8,8-trifluoro-7-hydroxy-7-trifluoromethyl-octyl ester (Example 1) (2.37 g, 0.005 mol) was dissolved in 21.33 g of PGMEA. The solution was placed in a round bottom flask equipped with condenser. Then 2.00 g Of ethylvinylether & 25 mg of trifluoroacetic acid was added. The reaction solution was stirred at room temperature for 6 hours. Then 1 g of basic aluminum oxide was added & stirring continued for another additional hour. The slurry was filtered & used for resist formulation.

EXAMPLE 7

Ethylvinylether protected poly-6-methacryloxy-bicyclo[2.2.1]heptane-2-carboxylic acid 8,8,8-trifluoro-7-hydroxy-7-trifluoromethyl-octyl ester (poly(XL)) (Example 6) was dissolved in PGMEA with 5 wt % 4-(1-butoxynaphthyl)tetrahydrothiophenium perfluorobutanesulfonate and 0.21 wt % 2-phenylbenzimidazole (both relative to polymer) to make a solution of 10% solid content. The resulting solution was filtered through a 0.2 µm filter. The resist was spin coated on an 8 inch silicon wafer which had a 900 Angstrom thick coating of Shipley's AR40 antireflective coating. The resist was baked at 90° C. for 60 seconds and exposed to ArF (193 nm wavelength) imaging radiation on an ASML scanner (0.75 NA) with a matrix of different doses from low doses to high doses. The exposed resist was baked at 60° C. for 90 seconds. The wafer was then developed using a single-spray puddle develop process for 60 seconds with 0.263 N TMAH developer (Moses Lake's AD-10). The dose to clear of the resist is measured to be 6.4 mj/cm2 and the contrast of the resist is 12.

EXAMPLE 8

Poly (I-co-XXI-co-XXII) (Example 5) was dissolved in PGMEA with 3% 4-(1-butoxynaphthyl)tetrahydrothiophenium perfluorobutanesulfonate, 6.6% Powderlink, and 0.25 wt % 2-phenylbenzimidazole (all relative to polymer) to make a solution of 10% solid content. The resulting solution was filtered through a 0.2 µm filter. The resist was spin coated on a 8 inch silicon wafer which had a 900 Angstrom thick coating of Shipley's AR40 antireflective coating. The resist was baked at 105° C. for 60 seconds and exposed to ArF (193 nm wavelength) imaging radiation on an ASML scanner (0.75 NA) with a matrix of different doses from low doses to high doses. The exposed resist was baked at 100° C. for 90 seconds. The wafer was then developed using a single-spray puddle develop process for 60 seconds with 0.263 N TMAH developer (Moses Lake's AD-10). The dose to gel of the resist is measured to be 2.25 mj/cm2 and the contrast (base10) of the resist is 8.

EXAMPLE 9
Comparison of dissolution rates and etch properties of poly-6-methacryloxy-bicyclo[2.2.1]heptane-2-carboxylic acid 8,8,8-trifluoro-7-hydroxy-7-trifluoromethyl-octyl ester (Example 1) and prior art polymers Structures of monomers disclosed in U.S. 2003/0224283:

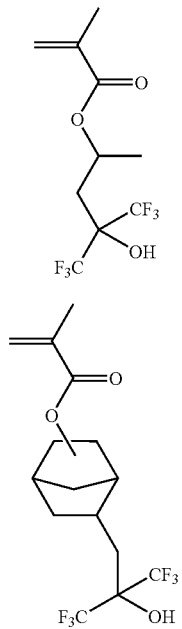

(XLVI)

(XLVII)

The dissolution rate of poly 6-methacryloxy-bicyclo[2.2.1]heptane-2-carboxylic acid 8,8,8-trifluoro-7-hydroxy-7-trifluoromethyl-octyl ester (I) in 0.263N TMAH developer was measured using quartz micro balance (QCM). Poly (I) demonstrated faster dissolution than both poly 1,1,1-trifluoro-2-trifluoromethyl-2-hydroxy-4-pentyl methacrylate (XLVI) and poly 2-{[5-(1',1',1'-trifluoro-2'-trifluoromethyl-2'hydroxy)propyl]norbornyl}methacrylate (XLVII) (Table 2). The etch properties of these three homopolymers were also studied under oxide etch condition (Ar/CF$_4$). As shown in Table 2, Poly (I) showed improved etch resistance (slower etch rate) than both Poly(XLVI) and Poly(XLVII).

TABLE 2

Comparison of dissolution rate and etch rate of different polymers

| POLYMER | MW/Pd | DR, nm/s | Etch Rate, Å/min |
| --- | --- | --- | --- |
| Poly (XLVI) | 14600/2.84 | 33 | 830 |
| Poly (XLVII) | 12800/2.61 | 9 | 762 |
| Poly (I) | 21000/2.57 | 126 | 676 |

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A photoresist composition comprising a polymer, the polymer comprising at least one monomer having a formula selected from the group consisting of:

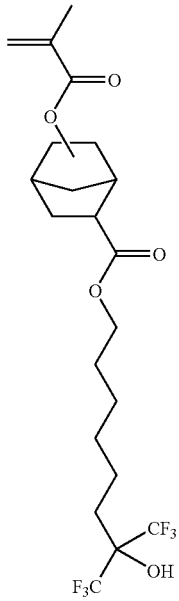

(I)

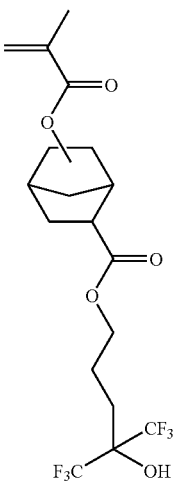

(II)

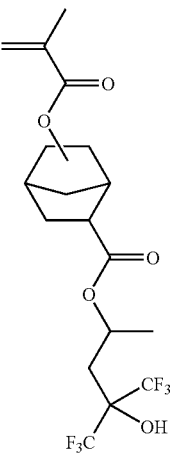

(III)

-continued
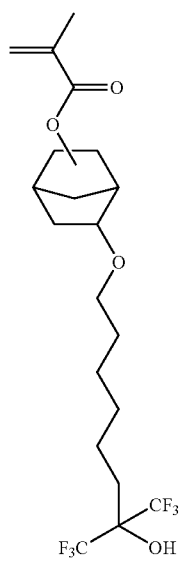
(IV)
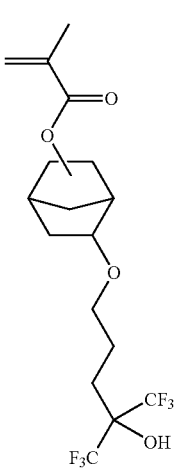
(V)
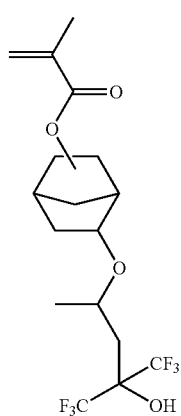
(VI)
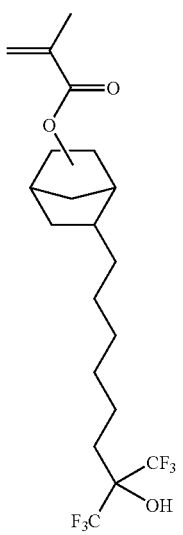
(VII)
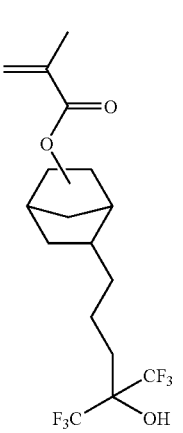
(VIII)
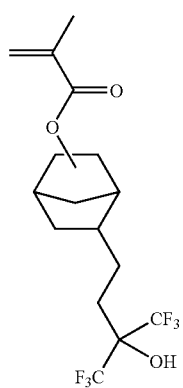
(IX)

-continued
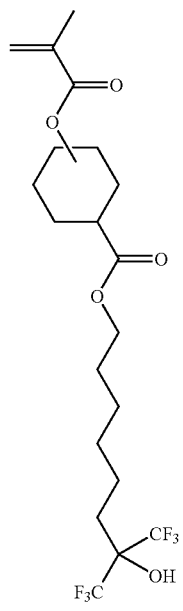
(X)
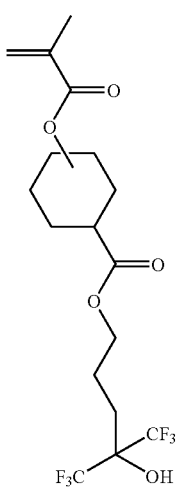
(XI)
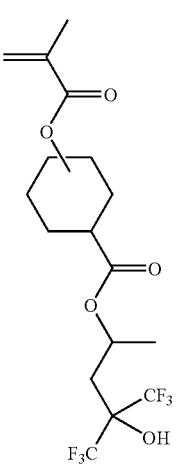
(XII)
-continued
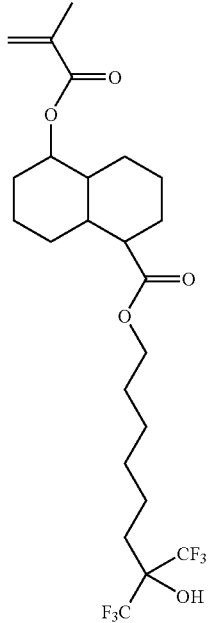
(XIII)
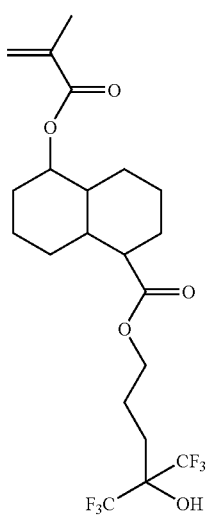
(XIV)
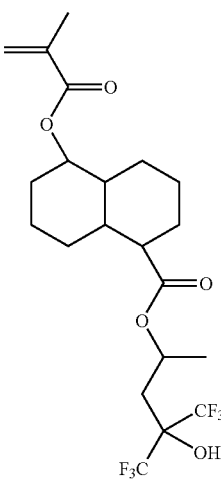
(XV)

-continued (XVI)

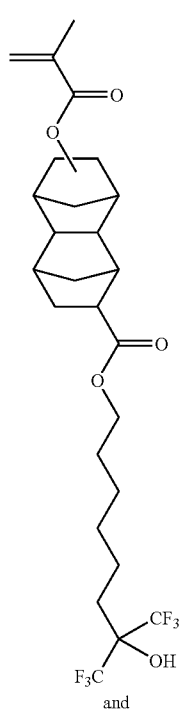

and (XVII)

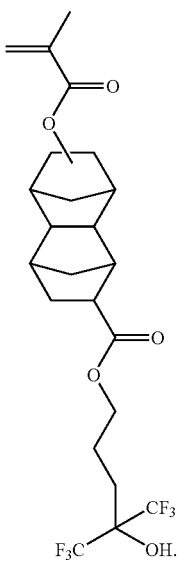

2. The photoresist composition of claim 1, further comprising at least one of a solvent, photoacid generator, crosslinking agent, basic compound, surfactant, latent basic compound, photobase generator, dissolution inhibitor, dissolution accelerator, adhesion promoter, and defoaming agent.

3. The photoresist composition of claim 2, wherein the photoacid generator comprises at least one of an onium salt, a succinimide derivative, a diazo compound, and a nitrobenzyl compound.

4. The photoresist composition of claim 3, wherein the photoacid generator comprises at least one of 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide.

5. The photoresist composition of claim 1, wherein the polymer further comprises at least one co-monomer which comprises an acid-labile moiety selected from the group consisting of a tertiary alkyl carbonate, a tertiary alkyl ester, a tertiary alkyl ether, an acetal and a ketal.

6. The photoresist composition of claim 5, wherein the at least one co-monomer is selected from the group consisting of:

(XXVII)

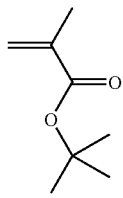

(XXVIII)

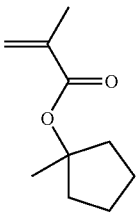

(XXIX)

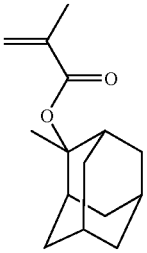

(XXX)

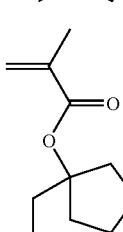

(XXXI)

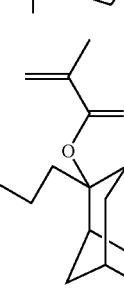

-continued (XXXII)

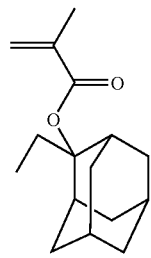

(XXXIII)

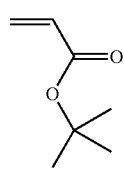

(XXXIV)

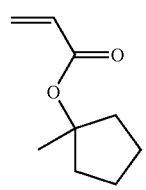

(XXXV)

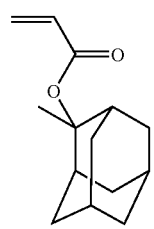

7. The photoresist composition of claim 1, wherein the polymer further comprises at least one co-monomer which comprises a polar moiety selected from the group consisting of lactone, sulfonamide, anhydride, and carboxylic acid.

8. The photoresist composition of claim 7, wherein the at least one co-monomer is selected from the group consisting of:

(XXXVI)

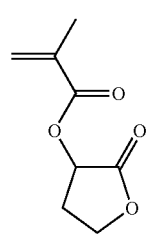

-continued (XXXVII)

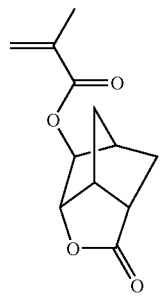

(XXXVIII)

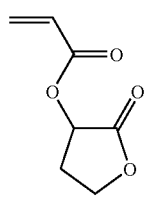

(XXXIX)

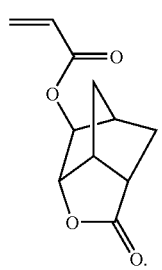

9. The photoresist composition of claim 1, wherein the composition further comprises a crosslinking agent.

10. The photoresist composition of claim 9, wherein the crosslinking agent comprises at least one of a glycouril, melamine, epoxide, furyl, tetrahydrofuryl, and vinyl ether.

11. The photoresist composition of claim 10, wherein said glycouril is represented by the formula

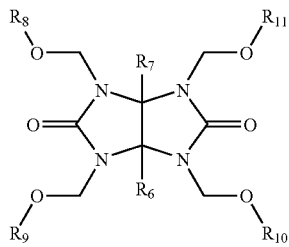

wherein $R_6$, $R_7$, $R_8$, $R_9$, $R_{10}$ and $R_{11}$, each represent hydrogen or an aliphatic group or an aromatic group.

12. The photoresist composition of claim 9, wherein the polymer further comprises at least one co-monomer which comprises a nucleophile.

13. The photoresist composition of claim 12, wherein said nucleophile is an alcohol.

14. The photoresist composition of claim 13, wherein the at least one co-monomer is selected from the group consisting of:

(XXI) 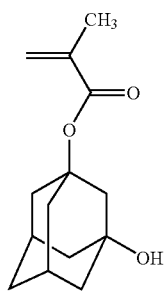
(XXII) 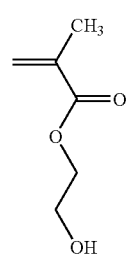
(XXIII) 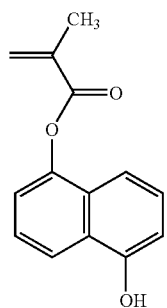
(XXIV) 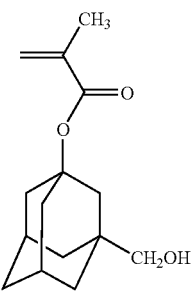
(XXV) 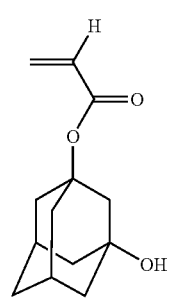
-continued
(XXVI) 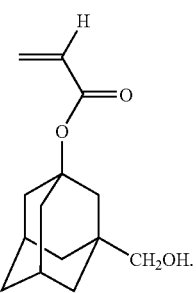
15. A positive photoresist composition comprising a polymer, the polymer comprising:
(i) a first monomer selected from the group consisting of:
(I) 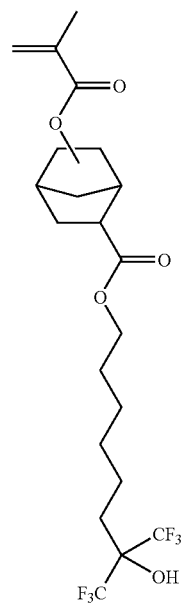
(II) 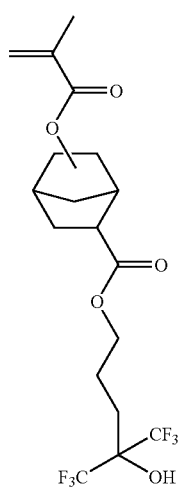

(III)
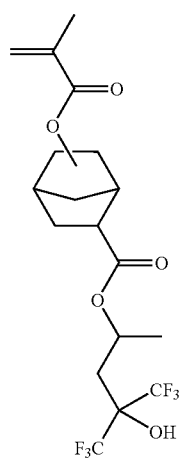
(ii) a second monomer selected from the group consisting of:
(XXVIII)
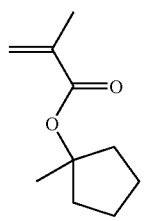
(XXIX)
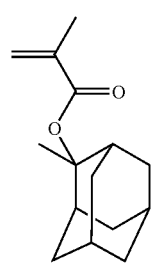
(XXX)
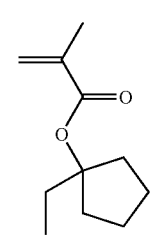
and (iii) a third monomer selected from the group consisting of:
(XXXVI)
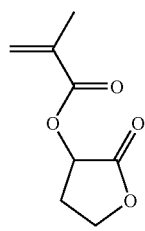
(XXXVII)
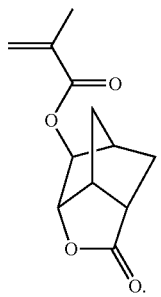
16. A negative photoresist composition comprising a polymer, the polymer comprising:
(i) a first monomer selected from the group consisting of:
(I)
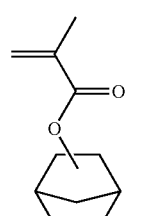
(II)
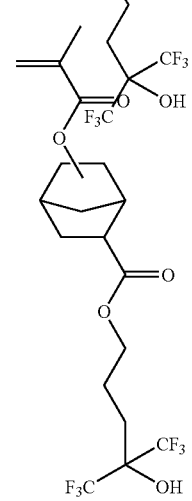

(III)
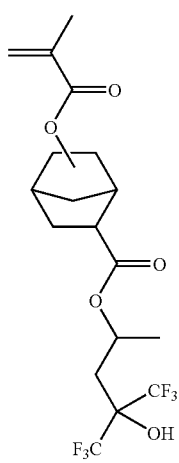
and (ii) a second monomer selected from the group consisting of:
(XXI)
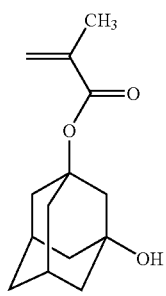
(XXII)
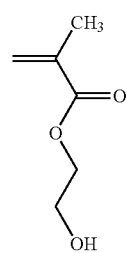
(XXIII)
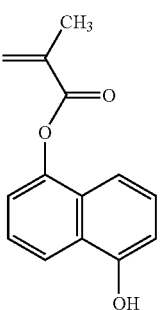
(XXIV)
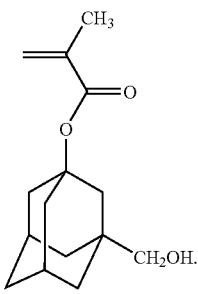
17. A positive photoresist composition comprising a polymer, the polymer comprising at least one monomer selected from the group consisting of:
(XL)
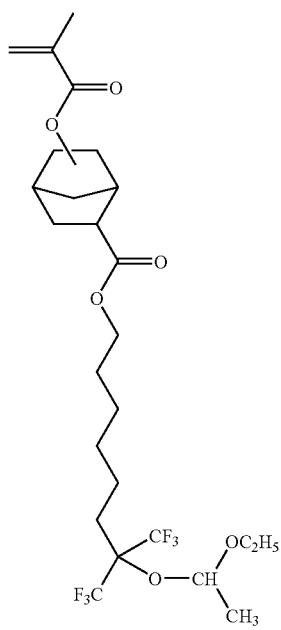
(XLI)
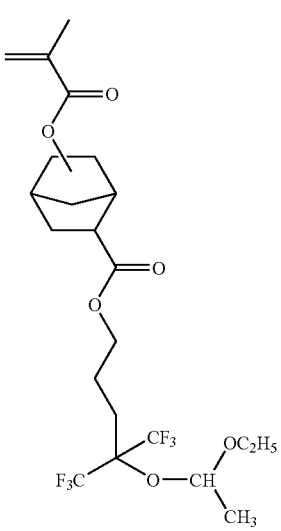

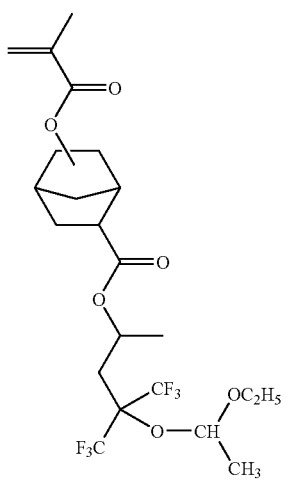
(XLII)
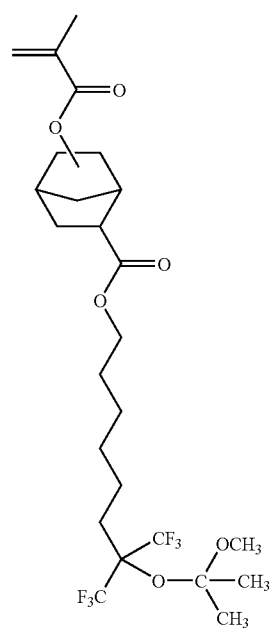
(XLIII)
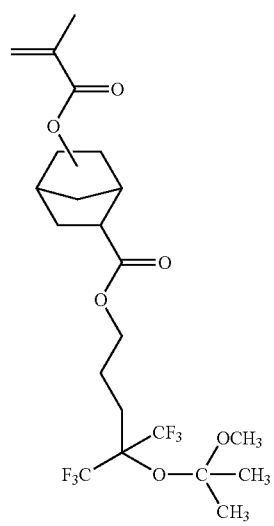
(XLIV)
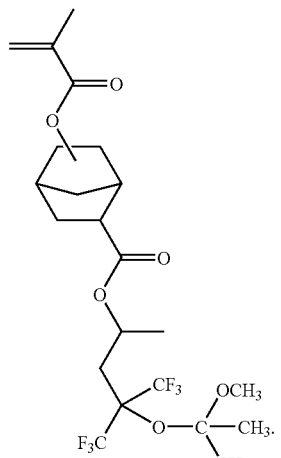
(XLV)
18. A method of patterning a substrate, the method comprising:
applying a photoresist composition to the substrate to form a film, the photoresist composition comprising a polymer, the polymer comprising at least one monomer selected from the group consisting of:
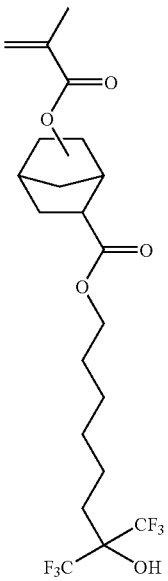
(I)
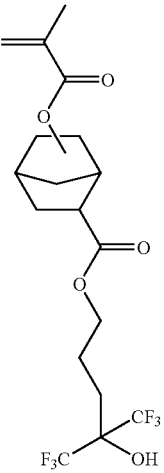
(II)

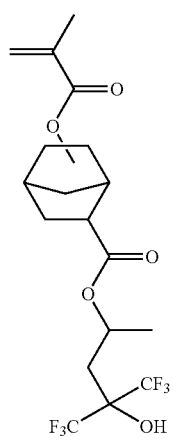
(III)
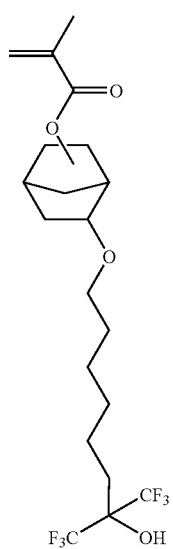
(IV)
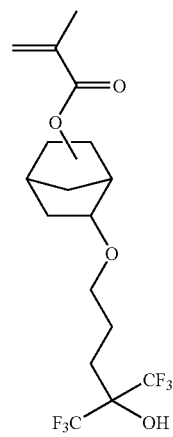
(V)
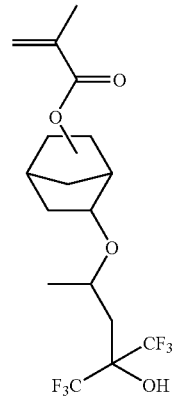
(VI)
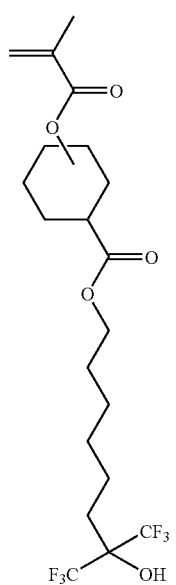
(VII)
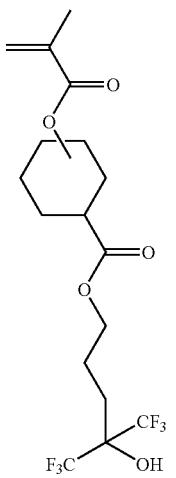
(VIII)

(IX)
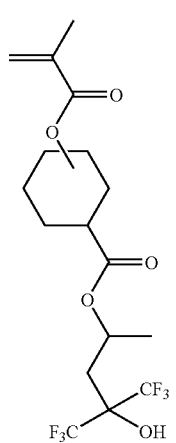
(X)
(XI)
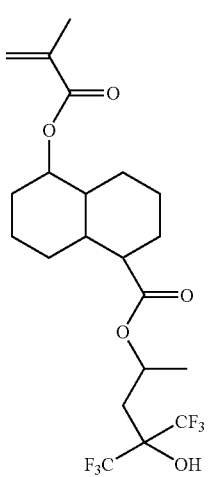
(XII)
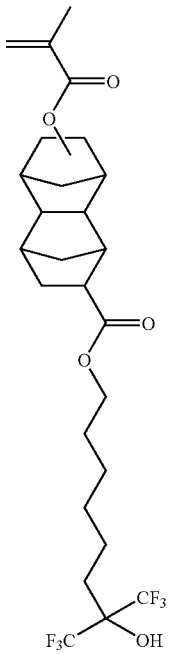
(XIII)
(XIV)
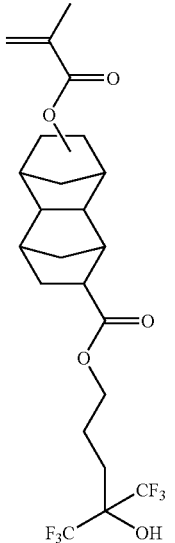

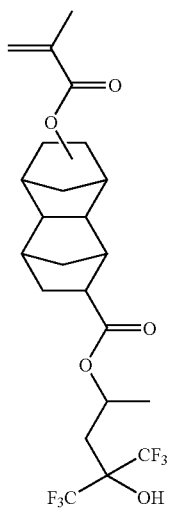

(XV)

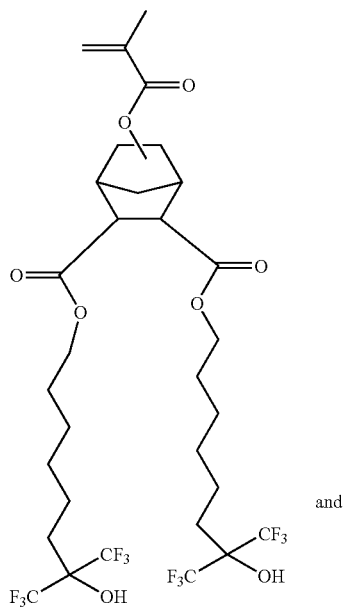

and (XVI)

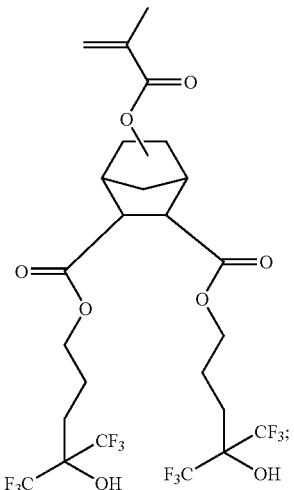

(XVII)

patternwise exposing the film to an imaging radiation source; and developing areas of the film to form a patterned substrate.

19. The method of claim 18, further comprising baking the film before exposing the film.

20. The method of claim 18, further comprising baking the film after exposing and before developing the film.

21. The method of claim 18, further comprising etching the patterned substrate.

22. The method of claim 21, wherein said etching comprises ion etching.

23. The method of claim 18, wherein said film is insoluble, and wherein said developing step renders said film soluble where exposed to the imaging radiation source.

24. The method of claim 23, further comprising removing said soluble film.

25. The method of claim 18, wherein said film is soluble, and wherein said developing step renders said film insoluble where exposed to the imaging radiation source.

26. The method of claim 25, further comprising the step of removing said soluble film.

* * * * *